United States Patent
Ma

(10) Patent No.: US 9,805,638 B2
(45) Date of Patent: Oct. 31, 2017

(54) SHIFT REGISTER, ARRAY SUBSTRATE AND DISPLAY APPARATUS

(71) Applicant: BOE Technology Group Co., Ltd., Beijing (CN)

(72) Inventor: Zhanjie Ma, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 23 days.

(21) Appl. No.: 14/772,224

(22) PCT Filed: Nov. 28, 2014

(86) PCT No.: PCT/CN2014/092512
§ 371 (c)(1),
(2) Date: Sep. 2, 2015

(87) PCT Pub. No.: WO2016/026233
PCT Pub. Date: Feb. 25, 2016

(65) Prior Publication Data
US 2016/0284263 A1  Sep. 29, 2016

(30) Foreign Application Priority Data

Aug. 22, 2014  (CN) .......................... 2014 1 0418847

(51) Int. Cl.
*G09G 3/20* (2006.01)
*G11C 19/28* (2006.01)
*G09G 3/36* (2006.01)

(52) U.S. Cl.
CPC ......... *G09G 3/2092* (2013.01); *G09G 3/3677* (2013.01); *G11C 19/28* (2013.01);
(Continued)

(58) Field of Classification Search
CPC ....... G09G 2310/0286; G09G 2310/08; G09G 3/20; G09G 3/2092; G09G 2330/028;
(Continued)

(56) References Cited

U.S. PATENT DOCUMENTS

2004/0109526 A1* 6/2004 Park .................. G11C 19/28
377/64
2004/0239608 A1* 12/2004 Chung .................. G11C 19/00
345/100
(Continued)

FOREIGN PATENT DOCUMENTS

| CN | 101202114 A | 6/2008 |
| CN | 102629463 A | 8/2012 |
| KR | 20140079106 A | 6/2014 |

OTHER PUBLICATIONS

May 28, 2015—International Search Report and Written Opinion Appn PCT/CN2014/092512 with English Tran.
(Continued)

*Primary Examiner* — Christopher E Leiby
(74) *Attorney, Agent, or Firm* — Banner & Witcoff, Ltd.

(57) ABSTRACT

There are provided a shift register, an array substrate and a display apparatus. The shift register comprises: a triggering module, output module, input terminal, first output terminal and a second output terminal, wherein: the trigger module is configured to, according to an input signal from the input terminal, output a triggering signal that has a phase the same as the input signal and delays half a clock cycle more than the input signal under the action of a clock signal; the output module is configured to output an output signal that has a phase opposite to the input signal and delays half a clock cycle more than the input signal to the first output terminal under the triggering of the triggering signal and under the action of the clock signal; and an operating voltage of a signal outputted from the first output terminal is supplied by a direct current power supply.

19 Claims, 2 Drawing Sheets

(52) U.S. Cl.
CPC .............. *G09G 2300/0809* (2013.01); *G09G 2310/0286* (2013.01); *G09G 2310/08* (2013.01); *G09G 2330/028* (2013.01)

(58) Field of Classification Search
CPC ... G09G 2300/0809; G06F 3/007; G06F 5/01; G06F 5/08; G06F 5/065; G06F 9/30134; G11C 19/00; G11C 19/28
See application file for complete search history.

(56) References Cited

U.S. PATENT DOCUMENTS

| | | | | |
|---|---|---|---|---|
| 2008/0218502 | A1* | 9/2008 | Lee | G09G 3/3674 345/208 |
| 2008/0316189 | A1* | 12/2008 | Choi | G09G 3/20 345/204 |
| 2012/0081346 | A1* | 4/2012 | Furuta | G11C 19/28 345/209 |
| 2012/0086703 | A1* | 4/2012 | Yokoyama | G09G 3/3655 345/215 |
| 2013/0038587 | A1* | 2/2013 | Song | G09G 5/18 345/211 |
| 2016/0012790 | A1* | 1/2016 | Zheng | G09G 3/3688 345/204 |
| 2016/0055814 | A1* | 2/2016 | Yang | G09G 3/3677 345/213 |
| 2016/0275847 | A1* | 9/2016 | Lin | G06F 1/04 |

OTHER PUBLICATIONS

Jul. 27, 2016—(CN)—Second Office Action Appn 201410418847.1 with English Tran.
Jan. 12, 2017—(CN) Third Office Action Appn 201410418847.1 with English Tran.

* cited by examiner

SHIFT REGISTER, ARRAY SUBSTRATE AND DISPLAY APPARATUS

The application is a U.S. National Phase Entry of International Application No. PCT/CN2014/092512 filed on Nov. 28, 2014, designating the United States of America and claiming priority to Chinese Patent Application No. 201410418847.1 filed on Aug. 22, 2014. The present application claims priority to and the benefit of the above-identified applications and the above-identified applications are incorporated by reference herein in their entirety.

TECHNICAL FIELD

The present disclosure relates to the display field, in particular to a shift register, an array substrate and a display apparatus.

BACKGROUND

In digital circuits, a shift register is a trigger-based device that operates in several same time pulses (clock signals). Data is input to the device in parallel or in serial. Then, each time pulse moves one bit towards the left or towards the right in sequence and is outputted via an output terminal.

A traditional shift register uses generally the way of performing triggering and outputting simultaneously. That is, in an arrangement of multiple shift registers connected in cascades, a signal outputted from an output terminal of one stage serves not only as an input triggering signal of a next stage of shift register, but also as an output signal of a present stage of shift register. Such shift register has simple configuration and wide applicability, and has already been applied in a variety of digital integrated circuits widely.

However, the output signal of this kind of the shift register would be affected by fluctuation of an alternating current pulse signal of a clock signal, thereby resulting in instability of the output signal and reduction of signal quality. By taking a specific actual application scenario as an example, when this shift register is applicable to a gate line driving circuit of an array substrate, an instable output signal would influence stability of display pixels, which causes display effect reduced or even display faulty occurs.

SUMMARY

In view of deficiencies in the prior art, there are provided in the present disclosure a shift register, an array substrate and a display apparatus, which would not be affected by fluctuation of an alternating current pulse signal by separating triggering and outputting in the shift register from each other and taking a direct current power supply as an operating voltage, so that stability of the output signal and display pixels can be raised.

According to one aspect of the present disclosure, there is provided a shift register comprising a triggering module, an output module, an input terminal, a first output terminal and a second output terminal, wherein:

the trigger module is configured to, according to an input signal from the input terminal, output a triggering signal that has a phase the same as the input signal and delays half a clock cycle more than the input signal to the second output terminal and the output module under the action of a clock signal;

the output module is configured to output an output signal that has a phase opposite to the input signal and delays half a clock cycle more than the input signal to the first output terminal under the triggering of the triggering signal and under the action of the clock signal; and an operating voltage of a signal outputted via the first output terminal is supplied by a direct current power supply.

Alternatively, the triggering module comprises six switching elements and one capacitor, wherein:

a second terminal of a first switching element is connected to the input terminal, a first terminal thereof is connected to a first terminal of a second switching element, a first terminal of the capacitor, and a control terminal of a sixth switching element;

a second terminal of the second switching element is connected to a control terminal of a third switching element;

a first terminal of the third switching element is connected to a second terminal of a fourth switching element, and a control terminal of a fifth switching element;

a first terminal of the fourth switching element is connected to a control terminal thereof;

a first terminal of the fifth switching element is connected to a second terminal of the capacitor, and a second terminal of the sixth switching element, and connected to the second output terminal and the output module.

Alternatively, a second terminal of the third switching element is connected to an operating voltage at a high level, and the control terminal and the first terminal of the fourth switching element are connected to an operating voltage at a low level.

Alternatively, the clock signal comprises a first clock signal and a second clock signal, wherein the first clock signal is connected to a control terminal of the first switching element, and the second clock signal is connected to a control terminal of the second switching element and a first terminal of the sixth switching element.

Alternatively, the output module comprises four switching elements, i.e., seventh, eighth, ninth and tenth switching elements, wherein:

a first terminal of the seventh switching element is connected to the triggering module, and a second terminal thereof is connected to a control terminal of the eighth switching element;

a first terminal of the eighth switching element is connected to a first terminal of the tenth switching element and is connected to the first output terminal;

a control terminal of the tenth switching element is connected to a second terminal of the ninth switching element;

a control terminal of the ninth switching element is connected to a first terminal thereof, and is connected to a second terminal of the tenth switching element.

Alternatively, a second terminal of the eighth switching element is connected to the operating voltage at the high level, and the control terminal and the first terminal of the ninth switching element are connected to the operating voltage at the low level.

Alternatively, the clock signal comprises the first clock signal and the second clock signal, wherein the second clock signal is connected to a control terminal of the seventh switching element.

Alternatively, the switching elements ate P channel type thin film transistors.

There is further provided an array substrate comprising any one of the shift registers described above.

There is further provided a display apparatus comprising the array substrate described above.

The present disclosure mainly makes the shift register be provided with two-stage output structure through the separate design of the triggering module and the output module, and the direct current power supply is used to supply the operating voltage for the output (i.e., the first output terminal) of the second stage, such that it would not be affected by fluctuation of the alternating current pulse signal.

When this shift register is applied to the array substrate particularly, the first output terminal is used for the outputting of a present row, and the second output terminal is used for the triggering of the outputting of a next row and the present row, so as to separate the triggering and the output from each other. Moreover, since the first output terminal that provides the gate line signal of the present row supplies the operating voltage by using the direct current power supply, its output would not be affected by fluctuation of the alternating current pulse signal and the output signal may be more stable, so that the display pixels would be more stable.

Of course, any product or method that implements the present disclosure does not necessarily require all the advantages described above.

DETAILED DESCRIPTION

In order to make technical solutions and advantages of embodiments of the present disclosure more clear, the technical solutions in the embodiments of the present disclosure will be described below by combining with the accompanying figures clearly and completely. Obviously, the embodiments described below are just a part of embodiments of the present disclosure, but not all the embodiments thereof.

Figure 1:
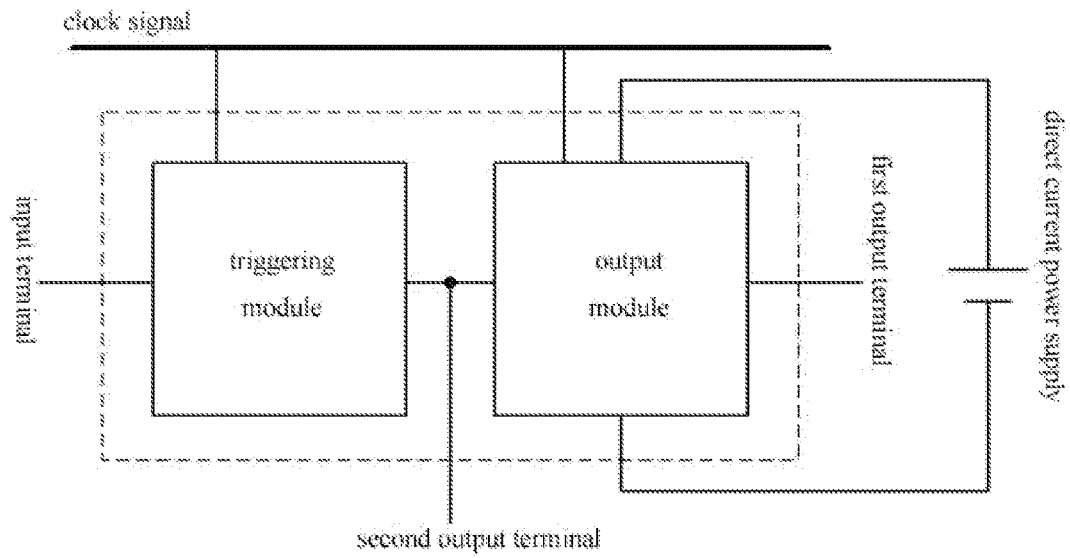
FIG. 1 is a schematic diagram of configuration of a shift register in an embodiment of the present disclosure.

FIG. 1 shows schematic diagram of configuration of a shift register in an embodiment of the present disclosure. Referring to FIG. 1, the shift register comprises a triggering module, an output module, an input terminal, a first output terminal and a second output terminal.

In FIG. 1, the trigger module is configured to, according to an input signal from the input terminal, output a triggering signal that has a phase the same as the input signal and delays half a clock cycle more than the input signal to the second output terminal and the output module under the action of a clock signal;

The output module is configured to output an output signal that has a phase opposite to the input signal and delays half a clock cycle more than the input signal to the first output terminal under the triggering of the triggering signal and under the action of the clock signal;

An operating voltage of an output signal outputted from the first output terminal is supplied by a direct current power supply.

It can be seen from FIG. 1 that the actual function of the triggering module is basically equivalent to the function of the shift register, while the output module realizes a two-stage output on such a basis. In terms of the connecting relationship, the triggering module is connected to an input and outputs a triggering signal to the second output terminal and the output module, while the output module would output the output signal to the first output terminal after being triggered by the triggering signal. Of course, the entire process is performed under the action of the clock signal.

Also, it can be derived by combining with the function of the shift register per se. Outputting the triggering signal and the output signal described herein actually refers to outputting an in-phase output pulse or an opposite-phase output pulse whose shape is the same as an input pulse according to the time sequence of the clock signal, both of the pulses only differs from each other in the time sequence of the clock signal, while the shape of the pulse is the same or opposite in phase.

Furthermore, the pulse described herein just refers to a single pulse signal (a low-high-low or high-low-high single square waveform) in the narrow sense. In fact, all the waveforms can be formed by superimposing several single pulse signals. Therefore, both of the pulses do not have any difference in substance and can be a high-low level waveform of a random shape in the broad sense.

Since the embodiment of the present disclosure uses the direct current power supply to supply the operating voltage for the first output terminal, the signal outputted from the first output terminal may not be affected by fluctuation of the clock alternating pulse signal, so that stability of the output signal can be ensured. In the gate line driving circuit for use in the display apparatus, this characteristic can ensure stability of the display pixels.

In order to further describe exemplary implementations in the embodiment of the present disclosure, an alternative triggering module and an alternative output module are presented herein respectively.

Figure 2:
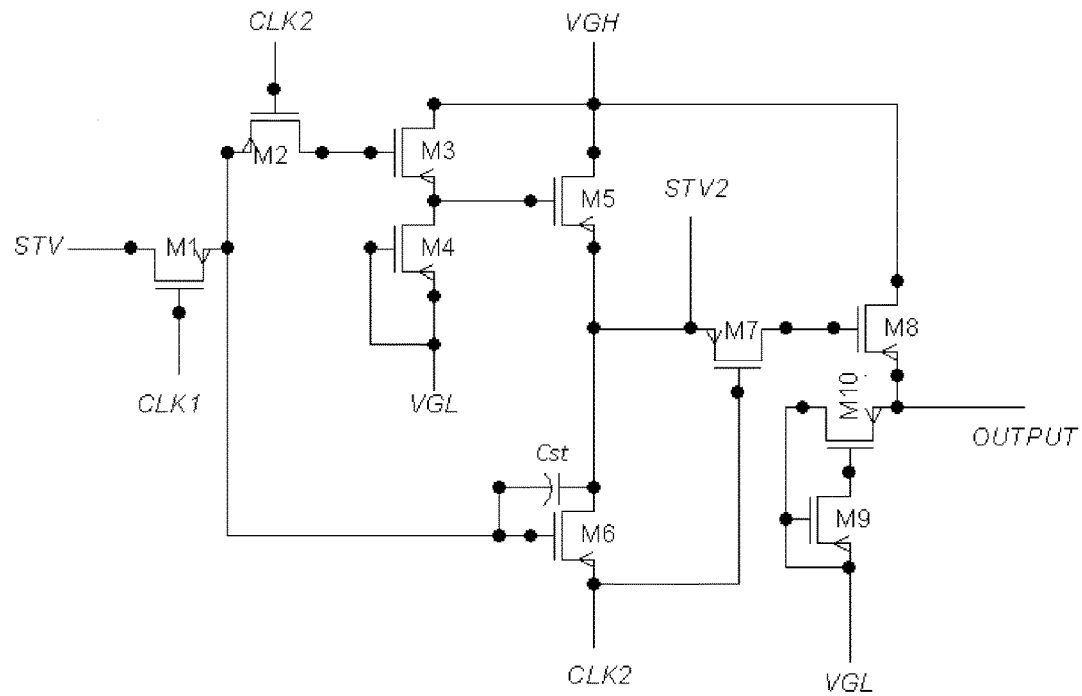
FIG. 2 is a schematic diagram of a circuit structure of a shift register in an embodiment of the present disclosure.

FIG. 2 shows a schematic diagram of a circuit structure of the shift register in an embodiment of the present disclosure. Referring to FIG. 2, the triggering module comprises six switching elements M1 to M6 and one capacitor Cst, wherein:

a second terminal of the first switching element M1 is connected to an input terminal STV, a first terminal thereof is connected to a first terminal of the second switching element M2, a first terminal of the capacitor Cst, and a control terminal of the sixth switching element M6;

a second terminal of the second switching element M2 is connected to a control terminal of the third switching element M3;

a first terminal of the third switching element M3 is connected to a second terminal of the fourth switching element M4, and a control terminal of the fifth switching element M5;

a first terminal of the fourth switching element M4 is connected to a control terminal thereof;

a first terminal of the fifth switching element M5 is connected to a second terminal of the capacitor, and a second terminal of the sixth switching element M6, and connected to the second output terminal STV2 and the output module.

The triggering module having the above configuration can output directly a triggering signal that has a phase the same as the input signal and delays half a clock cycle more than the input signal. In addition, the triggering module uses only six switching elements and one capacitor, and is capable of being adaptive to the manufacturing process of the display panel. The specific circuit timing of the triggering module will be described below.

Correspondingly, a second terminal of the third switching element M3 is connected to an operating voltage VGH at a high level, and the control terminal and the first terminal of the fourth switching element M4 are connected to an operating voltage VGL at a low level, so as to ensure consistency of the entire circuit.

Being consistent with the common habit in the circuit design, the clock signal herein is made to comprise a first clock signal CLK1 and a second clock signal CLK2. In general, CLK1 and CLK2 are square wave pulse signals with alternative occurrence of high level and low level which have inverse timings and fixed frequencies. Correspondingly, the first clock signal CLK1 is connected to a control terminal of the first switching element M1, and the second clock signal CLK2 is connected to a control terminal of the second switching element M2 and a first terminal of the sixth switching element M6.

The above description is an exemplary circuit structure of the triggering module. An output module that can be used in match with the triggering module will be described continuously.

Referring to FIG. 2, the output module comprises four switching elements M7 to M10, wherein:

a first terminal of the seventh switching element M7 is connected to the triggering module, and a second terminal thereof is connected to a control terminal of the eighth switching element M8;

a first terminal of the eighth switching element M8 is connected to a first terminal of the tenth switching element M10 and is connected to a first output terminal OUTPUT;

a control terminal of the tenth switching element M10 is connected to a second terminal of the ninth switching element M9;

a control terminal of the ninth switching element M9 is connected to a first terminal thereof, and is connected to a second terminal of the tenth switching element M10.

The output module having such configuration can output directly an output signal that has a phase opposite to the input signal and delays half a clock cycle more than the input signal. In addition, the output module uses only four switching elements, and is capable of being adaptive to the manufacturing process of the display panel. The specific circuit timing of the output module will be introduced below.

Correspondingly, a second terminal of the eighth switching element M8 is connected to the operating voltage VGH at the high level, and the control terminal and the first terminal of the ninth switching element M9 are connected to the operating voltage VGL at the low level, so as to ensure the consistency of the entire circuit. Corresponding to the above characteristics, the operating voltages VGH and VGL herein are supplied by the direct current power supply, so as to eliminate the influence of the alternating current pulse signal on the output.

In the entire circuit structure, the first clock signal CLK1 is connected to the control terminal of the first switching element M1, and the second clock signal CLK2 is connected to the control terminal of the second switching element M2, the first terminal of the sixth switching element M6 and the control terminal of the seventh switching element. Herein, only M7 belongs to the part of the output module. Thus it can be seen that the clock signal is not connected directly to an output signal channel in the output module, but is separated from the entire output signal channel via the control terminal of the seventh switching element M7. In this way, the output signal would not be affected by the alternating current pulse clock signal.

Alternatively, P channel type thin film transistor (TFT) is used as a switching element, whose control terminal is a gate of TFT, first terminal is a source of TFT, and second terminal is a drain of TFT. Of course, an N channel type thin film transistor can also be used. Then, the control terminal is the gate of TFT, the first terminal is the drain of TFT, and the second terminal is the source of TFT.

Figure 3:
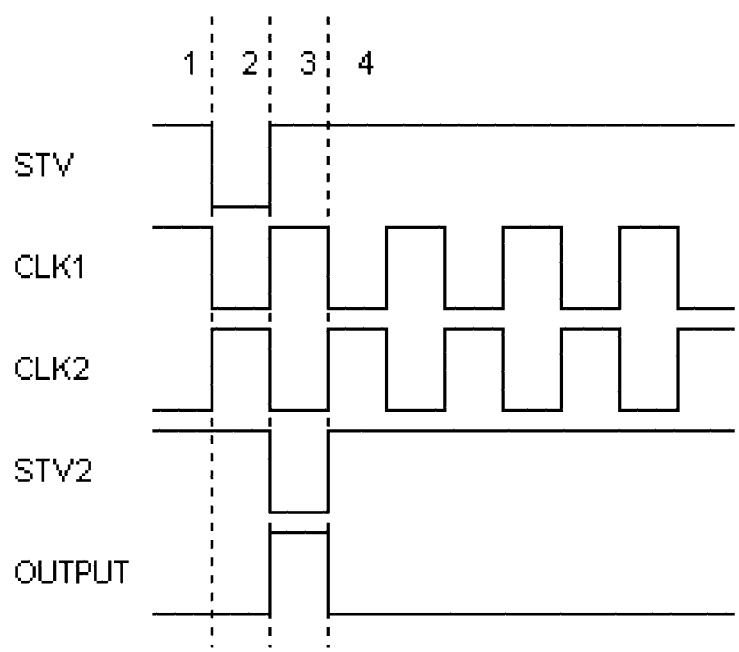
FIG. 3 is an operation timing diagram of a shift register in an embodiment of the present disclosure.

FIG. 3 is an operation timing diagram of the shift register in an embodiment of the present disclosure. For the case of applying the above circuit into the TFT display field (multiple shift registers are connected in cascades, the first output terminal OUTPUT is used for the output of the present row, and an second output terminal STV is used for triggering the output of the next row and the present row). Its entire operation timing diagram can be as shown in FIG. 3 (STV is corresponding to the input signal, STV2 is corresponding to the triggering signal, and OUTPUT is corresponding to the output signal). As shown in FIG. 3, the operation timing diagram comprises four phases, and the first to fourth phases are represented by 1, 2, 3, and 4 respectively.

1. First phase: STV and CLK1 are turned on, a STV signal is input to a gate of a transistor M6 through a transistor M1, and a potential is maintain through the capacitor Cst. At the same time, the STV signal enables the transistor M6 to be turned on and transmits a turn-off signal (a high voltage signal) of CLK2 to a STV2 line through the transistor M6. Now, in an inverter being constituted of transistors M3 and M4, since the transistor M3 is turned off, the inverter outputs a turn-on potential (a low voltage signal) controlled by the transistor M4, so that a transistor M5 is turned on to output also a VGH high voltage signal to the STV2 line. At the same time, since a transistor M7 controlled by CLK2 is in a turn-off state, such that M8 in the configuration of the inverter being constituted of transistors M8, M9, and M10 is in the turn-off state, the inverter outputs a VGL low voltage signal controlled by M9 and M10, and the low voltage signal is transmitted to OUTPUT of the present stage.

2. Second phase: CLK1 becomes a high voltage turn-off signal, and CLK2 becomes a low voltage turn-on signal. Since the low voltage signal at the gate of the transistor M6 is maintained through the capacitor Cst, the transistor M6 is turned on, so that the low voltage signal of CLK2 is transmitted to the STV2 line through the transistor M6. At the same time, the transistor M2 controlled by CLK2 is also turned on to transmit the low voltage signal at the gate of M6 to the gate of the transistor M3 through M2, so that the transistor M3 is turned on. Now, the inverter being constituted of M3 and M4 outputs a VGH signal, and this signal is transmitted to the gate of M5 through M3, so that M5 is in the turn-off state. In this way, the first stage of configuration outputs the low voltage turn-on signal, which is a turn-on signal of the next row of shift register on one hand, and is also a triggering signal of the second stage of configuration of the present row. When the low voltage signal of CLK 2 is transmitted to STV2, M7 controlled by CLK2 is turned on to transmit the low voltage signal to the gate of M8. Now, the inverter being constituted of M8, M9, and M10 outputs the VGH high voltage signal controlled by M8.

3. Third phase, CLK1 becomes a low voltage start signal, and STV is a high voltage turn-off signal at this time. M1 controlled by CLK1 is turned on, and the high voltage STV signal is transmitted to the gate of M6 and is maintained by the capacitor Cst, such that M6 is in the turn-off state. Now, the inverter being constituted of M3 and M4 outputs the VGL signal, and this VGL signal makes M5 turned on, and the VGH signal is transmitted to the STV2 line. At this time, the inverter being constituted of M8, M9, and M10 outputs the VGL signal, and this VGL signal is transmitted to OUTPUT.

4. Fourth phase: CLK2 becomes the turn-on signal, and also the inverter being constituted of M3 and M4 is made to output VGL to the gate of M5, so that the VGH signal is transmitted to the STV2 line through M5. The inverter being constituted of M8, M9, and M10 still outputs the VGL low voltage signal. The subsequent CLK1 and CLK2 repeat the actions in the third and fourth phases. In this way, the output of the first stage is maintained as the VGH high voltage signal, and the output of the second stage is maintained as the VGL low voltage signal.

Thus it can be seen that the above circuit can realize shifting and outputting functions of the shift register. When being particularly applied to the gate driving circuit herein, the circuit can make the triggering and outputting separated from each other. Furthermore, since the first output terminal that provides the gate line signal of the present row supplies the operating voltage by using the direct current power supply, its output would not be affected by fluctuation of the alternating current pulse signal and the output signal would be more stable, so that the display pixels become more stable.

Of course, the above circuit is just for illustration. The operating environment, the operating mode and the structures of the specific triggering module and structure of the output module of the shift register of the circuit can be adjusted according to the embodiments of the present disclosure, which apparently does not depart from the spirit and scope of the technical solutions in the embodiments of the present disclosure.

Based on the same disclosed concept, there is provided in an embodiment of the present disclosure an array substrate comprising any one of the shift registers described above. For example, it can apply the shift register to the gate line driving circuit of the array substrate, and provides a gate line driving signal to a pixel unit by means of multiple shift register units connected in cascades. In this situation, an input terminal of each stage of shift register is connected a second output terminal of a previous stage of shift register, and a first output terminal of each stage of shift register is connected to an gate line driving signal output of the present row.

As described above, since the first output terminal that provides the gate line signal of the present row supplies the operating voltage by using the direct current power supply, its output would not be affected by fluctuation of the alternating current pulse signal, and the output signal would be more stable, so that the display pixels also become more stable.

Of course, based on the same concept, this shift register can also be used in other parts of the array substrate. Furthermore, the operating mode of the shift register is not limited to the same shift registers connected cascades, but can also be replaced with or combined with other circuit structures.

Based on the same disclosed concept, there is provided in an embodiment of the present disclosure a display apparatus comprising any array substrate described above. The display apparatus may be can be any product or components having a display function, such as a liquid crystal panel, an electronic paper, an OLED panel, a mobile phone, a tablet computer, a TV set, a display, a notebook computer, a digital photo frame, and a navigator and so on.

To sum up, there is provided in the present disclosure a shift register, an array substrate and a display apparatus, which would not be affected by fluctuation of an alternating current pulse signal by separating the triggering and outputting in the shift register from each other and taking a direct current power supply as the operating voltage, so that stability of the output signal and display pixels can be raised.

It should be noted that the relational terms such as first and second and so on in the present disclosure are just used to distinct one entity or operation from another entity or operation, while does not require or suggest that there exists any actual relationship or sequence among these entities or operations. Furthermore, terms of "include" and "comprise" or any other variants mean to cover nonexclusive including, so that processes, methods, objects or devices comprising a series of elements not only comprise those elements, but also comprise other elements not listed explicitly, or further comprise elements inherent in the processes, methods, objects or devices. In the case of no further limitation, the element defined by the sentence of "comprising a . . . " does not exclude that there exists additional same element in the processes, methods, objects or devices comprising the element.

The above embodiments are just used for describing the technical solutions of the present disclosure, instead of limiting the technical solutions. Although the present disclosure is described in detail by referring to the embodiments described above, those ordinary skilled in the art shall understand that they can still make modifications to the technical solutions disclosed in the respective embodiments described above, or make equivalent replacements of a part of technical features. And these modifications or replacements shall not make the substance of the corresponding technical solutions depart from the spirit and scope of the technical solutions in the respective embodiments of the present disclosure.

The present application claims the priority of a Chinese patent application No. 201410418847.1 filed on Aug. 22, 2014. Herein, the content disclosed by the Chinese patent application is incorporated in full by reference as a part of the present disclosure.

What is claimed is:

1. A shift register comprising a triggering module, an output module, an input terminal, a first output terminal and a second output terminal, wherein:
    an output terminal of the trigger module is connected to the second output terminal, and is configured to, according to an input signal from the input terminal, output a triggering signal that has a phase the same as the input signal and delays half a clock cycle more than the input signal to the second output terminal and the output module under the action of a clock signal;
    an input terminal of the output module is connected to the output terminal of the trigger module, and is configured to output an output signal that has a phase opposite to the input signal and delays half a clock cycle more than the input signal to the first output terminal under the triggering of the triggering signal and under the action of the clock signal; and
    an operating voltage of a signal outputted from the first output terminal is supplied by a direct current power supply,
    wherein the triggering module comprises six switching elements and one capacitor, wherein:
    a second terminal of a first switching element is connected to the input terminal, a first terminal thereof is connected to a first terminal of a second switching element, a first terminal of the capacitor, and a control terminal of a sixth switching element;
    a second terminal of the second switching element is connected to a control terminal of a third switching element;
    a first terminal of the third switching element is connected to a second terminal of a fourth switching element, and a control terminal of a fifth switching element;
    a first terminal of the fourth switching element is connected to a control terminal thereof; and a first terminal of the fifth switching element is connected to a second terminal of the capacitor, and a second terminal of the sixth switching element, and connected to the second output terminal and the output module.

2. The shift register according to claim 1, wherein a second terminal of the third switching element is connected to an operating voltage at a high level, and the control terminal and the first terminal of the fourth switching element are connected to an operating voltage at a low level.

3. The shift register according to claim 1, wherein the clock signal comprises a first clock signal and a second clock signal, wherein the first clock signal is connected to a control terminal of the first switching element, and the second clock signal is connected to a control terminal of the second switching element and a first terminal of the sixth switching element.

4. The shift register according to claim 1, wherein the output module comprises four switching elements: seventh to tenth switching elements, wherein:
 a first terminal of the seventh switching element is connected to the triggering module, and a second terminal thereof is connected to a control terminal of the eighth switching element;
 a first terminal of the eighth switching element is connected to a first terminal of the tenth switching element and is connected to the first output terminal;
 a control terminal of the tenth switching element is connected to a second terminal of the ninth switching element; and
 a control terminal of the ninth switching element is connected to a first terminal thereof, and is connected to a second terminal of the tenth switching element.

5. The shift register according to claim 4, wherein a second terminal of the eighth switching element is connected to the operating voltage at the high level, and the control terminal and the first terminal of the ninth switching element are connected to the operating voltage at the low level.

6. The shift register according to claim 4, wherein the clock signal comprises the first clock signal and the second clock signal, wherein the second clock signal is connected to a control terminal of the seventh switching element.

7. The shift register according to claim 1, wherein the switching elements ate P channel type thin film transistors.

8. An array substrate, comprising the shift register according to claim 1.

9. A display apparatus, comprising the array substrate according to claim 8.

10. The shift register according to claim 2, wherein the clock signal comprises a first clock signal and a second clock signal, wherein the first clock signal is connected to a control terminal of the first switching element, and the second clock signal is connected to a control terminal of the second switching element and a first terminal of the sixth switching element.

11. The shift register according to one of claim 2, wherein the output module comprises four switching elements: seventh to tenth switching elements, wherein:
 a first terminal of the seventh switching element is connected to the triggering module, and a second terminal thereof is connected to a control terminal of the eighth switching element;
 a first terminal of the eighth switching element is connected to a first terminal of the tenth switching element and is connected to the first output terminal;
 a control terminal of the tenth switching element is connected to a second terminal of the ninth switching element; and
 a control terminal of the ninth switching element is connected to a first terminal thereof, and is connected to a second terminal of the tenth switching element.

12. The shift register according to one of claim 3, wherein the output module comprises four switching elements: seventh to tenth switching elements, wherein:
 a first terminal of the seventh switching element is connected to the triggering module, and a second terminal thereof is connected to a control terminal of the eighth switching element;
 a first terminal of the eighth switching element is connected to a first terminal of the tenth switching element and is connected to the first output terminal;
 a control terminal of the tenth switching element is connected to a second terminal of the ninth switching element; and
 a control terminal of the ninth switching element is connected to a first terminal thereof, and is connected to a second terminal of the tenth switching element.

13. The shift register according to claim 5, wherein the clock signal comprises the first clock signal and the second clock signal, wherein the second clock signal is connected to a control terminal of the seventh switching element.

14. The array substrate according to claim 8, wherein the triggering module comprises six switching elements and one capacitor, wherein:
 a second terminal of a first switching element is connected to the input terminal, a first terminal thereof is connected to a first terminal of a second switching element, a first terminal of the capacitor, and a control terminal of a sixth switching element;
 a second terminal of the second switching element is connected to a control terminal of a third switching element;
 a first terminal of the third switching element is connected to a second terminal of a fourth switching element, and a control terminal of a fifth switching element;
 a first terminal of the fourth switching element is connected to a control terminal thereof; and
 a first terminal of the fifth switching element is connected to a second terminal of the capacitor, and a second terminal of the sixth switching element, and connected to the second output terminal and the output module.

15. The array substrate according to claim 14, wherein a second terminal of the third switching element is connected to an operating voltage at a high level, and the control terminal and the first terminal of the fourth switching element are connected to an operating voltage at a low level.

16. The array substrate according to claim 14, wherein the clock signal comprises a first clock signal and a second clock signal, wherein the first clock signal is connected to a control terminal of the first switching element, and the second clock signal is connected to a control terminal of the second switching element and a first terminal of the sixth switching element.

17. The array substrate according to claim 14, wherein the output module comprises four switching elements: seventh to tenth switching elements, wherein:
 a first terminal of the seventh switching element is connected to the triggering module, and a second terminal thereof is connected to a control terminal of the eighth switching element;

a first terminal of the eighth switching element is connected to a first terminal of the tenth switching element and is connected to the first output terminal;

a control terminal of the tenth switching element is connected to a second terminal of the ninth switching element; and a control terminal of the ninth switching element is connected to a first terminal thereof, and is connected to a second terminal of the tenth switching element.

18. The array substrate according to claim 17, wherein a second terminal of the eighth switching element is connected to the operating voltage at the high level, and the control terminal and the first terminal of the ninth switching element are connected to the operating voltage at the low level.

19. The array substrate according to claim 17, wherein the clock signal comprises the first clock signal and the second clock signal, wherein the second clock signal is connected to a control terminal of the seventh switching element.

* * * * *